(12) United States Patent
Jansen et al.

(10) Patent No.: US 10,093,581 B2
(45) Date of Patent: Oct. 9, 2018

(54) REFRACTORY BATCH AND USE THEREOF

(71) Applicant: Refratechnik Holding GmbH, Ismaning (DE)

(72) Inventors: Helge Jansen, Friedland (DE); Volker Stein, Goettingen (DE); Thomas Schemmel, Meerbusch (DE)

(73) Assignee: Refratechnik Holding GmbH, Ismaning (DE)

( * ) Notice: Subject to any disclaimer, the term of this patent is extended or adjusted under 35 U.S.C. 154(b) by 0 days.

(21) Appl. No.: 14/392,217

(22) PCT Filed: Apr. 30, 2014

(86) PCT No.: PCT/EP2014/058851
§ 371 (c)(1),
(2) Date: Dec. 24, 2015

(87) PCT Pub. No.: WO2014/206602
PCT Pub. Date: Dec. 31, 2014

(65) Prior Publication Data
US 2016/0176762 A1  Jun. 23, 2016

(30) Foreign Application Priority Data
Jun. 28, 2013 (DE) .......................... 10 2013 010 854

(51) Int. Cl.
*C04B 35/20* (2006.01)
*C04B 35/66* (2006.01)
*C04B 35/043* (2006.01)
*C04B 35/16* (2006.01)
*C04B 35/63* (2006.01)
(Continued)

(52) U.S. Cl.
CPC ............ *C04B 35/20* (2013.01); *C04B 35/013* (2013.01); *C04B 35/0435* (2013.01); *C04B 35/16* (2013.01); *C04B 35/6269* (2013.01); *C04B 35/62655* (2013.01); *C04B 35/63* (2013.01); *C04B 35/66* (2013.01); *C04B 2235/3206* (2013.01); *C04B 2235/3222* (2013.01); *C04B 2235/3241* (2013.01); *C04B 2235/3243* (2013.01); *C04B 2235/3244* (2013.01); *C04B 2235/3248* (2013.01); *C04B 2235/3418* (2013.01); *C04B 2235/3445* (2013.01); *C04B 2235/3826* (2013.01); *C04B 2235/3873* (2013.01); *C04B 2235/404* (2013.01); *C04B 2235/5427* (2013.01); *C04B 2235/5436* (2013.01); *C04B 2235/5472* (2013.01); *C04B 2235/606* (2013.01); *C04B 2235/608* (2013.01); *C04B 2235/61* (2013.01); *C04B 2235/77* (2013.01); *C04B 2235/96* (2013.01)

(58) Field of Classification Search
CPC ... C04B 35/20; C04B 35/013; C04B 35/0435; C04B 35/16; C04B 35/62655; C04B 35/63; C04B 35/66
See application file for complete search history.

(56) References Cited

U.S. PATENT DOCUMENTS 2,943,008 A * 6/1960 Saunders ................ B32B 18/00
264/112
3,060,040 A * 10/1962 Bristow ................. C04B 35/18
501/153
(Continued)

FOREIGN PATENT DOCUMENTS

| CL | 199901359 | 3/2000 |
| CL | 200402756 | 2/2006 |

(Continued)

OTHER PUBLICATIONS

ISO 836, Terminology for refractories, First edition, 2001-13-15, 40 pages.
DIN 51060, Definition der Begriffe feueifest, hochfeuerfest, Jun. 2000, 1 page.
International Search Report of PCT/EP2014/058851, dated Jul. 4, 2014.
Michael D. Crites, et al., Interaction of Chrome-Free Refractories with Copper Smelting and Converting Slags, Canadian Metallurgical Quarterly, vol. 39, No. 2, pp. 129-134 (2000).
Rejneet Kaur, "FCS Slag for Continuous Copper Converting", Literature Review, Chapter 2.5.1, pp. 53-59 (Jul. 2007).
(Continued)

*Primary Examiner* — Nahida Sultana
(74) *Attorney, Agent, or Firm* — Collard & Roe, P.C.

(57) ABSTRACT

A batch made of refractory mineral materials for lining of assemblies used for nonferrous metal melts, contains over 90% by weight of a mixture of the following constituents:— from 3 to 74% by weight of at least one coarse-grain raw olivine material with at least 70% by weight forsterite content and having grain sizes of 50% by weight over 0.1 mm—from 25 to 49% by weight of at least one ground magnesia with grain sizes of 50% by weight≤1 mm—from 0.9 to 14% by weight of at least one ground silicon carbide (SiC) with grain sizes of 50% by weight≤1 mm—from 0.1 to 10% by weight of at least one fine-particle dry pulverulent silica with particle sizes≤500 μm—from 0 to 4% by weight of at least one antioxidant known per se for refractory products—from 0 to 4% by weight of at least one additional granulated refractory raw material known per se, more particularly having grain sizes of 50% by weight, in particular of 80% by weight, preferably of 100% by weight over 0.1 mm—from 0 to 2% by weight of at least one additive known per se for the production of refractory products from batches—from 0 to 4% by weight of at least one additional substance known per se made of ground refractory materials and/or in the form of what is known as medium-grain-size material and/or of what is known as coarse-grain-size material—from 0 to 10% by weight of at least one binder known per se for refractory materials, e.g. in dry form or in ancillary packaging in liquid form.

31 Claims, No Drawings

(51) Int. Cl.
*C04B 35/01* (2006.01)
*C04B 35/626* (2006.01)

(56) References Cited

U.S. PATENT DOCUMENTS

| | | | | |
|---|---|---|---|---|
| 3,248,239 A * | 4/1966 | Heuer | | C04B 35/01 501/116 |
| 3,285,760 A * | 11/1966 | Hildinger | | C21C 5/44 264/DIG. 20 |
| 4,174,970 A * | 11/1979 | Gelsdorf | | C21B 7/14 501/89 |
| 4,334,029 A * | 6/1982 | Naito | | C04B 28/26 501/109 |
| 4,497,901 A * | 2/1985 | Ohtsuki | | C04B 35/013 501/101 |
| 4,885,203 A * | 12/1989 | Wakat | | C04B 38/08 110/338 |
| 4,957,554 A * | 9/1990 | Mathers | | C04B 35/195 106/35 |
| 5,366,944 A * | 11/1994 | Rumpeltin | | C04B 35/6303 501/101 |
| 5,374,593 A * | 12/1994 | Huard | | C04B 35/20 501/108 |
| 5,453,408 A * | 9/1995 | Huard | | C04B 35/20 423/331 |
| 8,030,235 B2 * | 10/2011 | Miglani | | B22D 41/02 501/108 |
| 8,030,236 B2 | 10/2011 | Klischat et al. | | |
| 8,481,152 B2 * | 7/2013 | Shuba | | C04B 41/4539 428/305.5 |
| 8,691,172 B2 * | 4/2014 | DeSanto | | C01B 33/22 423/331 |
| 9,403,728 B2 * | 8/2016 | Jansen | | F27D 1/0006 |
| 2002/0107133 A1 * | 8/2002 | Troczynski | | C04B 28/34 501/1 |
| 2002/0128142 A1 * | 9/2002 | Godeke | | C04B 28/26 501/80 |
| 2003/0153648 A1 * | 8/2003 | Chen | | B22C 1/10 523/139 |
| 2004/0157724 A1 * | 8/2004 | Doza | | C04B 33/04 501/95.1 |
| 2004/0157725 A1 * | 8/2004 | Doza | | C04B 33/04 501/95.1 |
| 2006/0009346 A1 | 1/2006 | Gist et al. | | |
| 2006/0091070 A1 * | 5/2006 | Aufderheide | | B01D 39/2079 210/510.1 |
| 2007/0203013 A1 * | 8/2007 | Harmuth | | C04B 35/013 501/133 |
| 2009/0227442 A1 * | 9/2009 | Klischat | | C04B 35/013 501/111 |
| 2009/0286668 A1 * | 11/2009 | Nakamura | | C04B 35/013 501/120 |
| 2010/0009840 A1 * | 1/2010 | Pattillo | | C22C 29/005 501/103 |
| 2010/0107509 A1 * | 5/2010 | Guiselin | | B24D 3/00 51/298 |
| 2011/0283836 A1 * | 11/2011 | Hitchings | | C04B 41/009 75/407 |
| 2012/0142518 A1 * | 6/2012 | Pattillo | | C04B 35/013 501/89 |
| 2012/0309608 A1 * | 12/2012 | Francy | | C04B 35/1015 501/89 |
| 2013/0040082 A1 * | 2/2013 | Mascia | | C04B 35/16 428/34.1 |
| 2013/0122267 A1 * | 5/2013 | Riman | | C04B 14/043 428/201 |
| 2013/0137056 A1 | 5/2013 | Vardy et al. | | |
| 2013/0189493 A1 * | 7/2013 | Decker | | F27D 1/0006 428/172 |
| 2014/0024520 A1 * | 1/2014 | Xiong | | C04B 35/101 501/128 |
| 2014/0261113 A1 * | 9/2014 | Scheubel | | C04B 35/043 110/323 |
| 2015/0175488 A1 * | 6/2015 | Jansen | | F27D 1/0006 501/88 |
| 2017/0341984 A1 * | 11/2017 | Jansen | | C04B 35/043 |
| 2018/0016191 A1 * | 1/2018 | Jansen | | C04B 35/043 |

FOREIGN PATENT DOCUMENTS

| | | |
|---|---|---|
| CL | 200502716 | 5/2006 |
| CL | 200502341 | 1/2007 |
| CN | 101 328 070 A | 12/2008 |
| CN | 101 607 826 A | 12/2009 |
| DE | 14 71 231 A1 | 5/1969 |
| DE | 20 2012 012495 U1 | 3/2013 |
| DE | 10 2012 015 026 A1 | 1/2014 |
| GB | 1 235 959 A | 6/1971 |
| JP | S48-005637 A | 1/1973 |
| JP | S49 5407 A | 2/1974 |
| JP | S58-125659 A | 7/1983 |
| JP | H06-316466 A | 11/1994 |
| RU | 2412132 C2 | 2/2011 |
| WO | 2014/016010 A1 | 1/2014 |

OTHER PUBLICATIONS

Chilean Office Action with Search Report in CL 2015-3637 dated Jun. 5, 2017 with translation of relevant parts.
Notification of Reasons for Refusal in JP 2016-522347, dated Oct. 4, 2017.
Gerald Routschka and Hartmut Wuthnow, Refratechnik—Refractory concretes—products and service: Chapter 3, "Raw Materials, Binders, Special Additives," pp. 39-54 from the pocket manual "Refractory Materials," published in 2008 (total of 9 pages).

* cited by examiner

REFRACTORY BATCH AND USE THEREOF

CROSS REFERENCE TO RELATED APPLICATIONS

This application is the National Stage of PCT/EP2014/058851 filed on Apr. 30, 2014, which claims priority under 35 U.S.C. § 119 of German Application No. 10 2013 010 854.3 filed on Jun. 28, 2013, the disclosure of which is incorporated by reference. The international application under PCT article 21(2) was not published in English.

The invention relates to a refractory batch according to ISO/R 836, DIN 51060 in the form of a dry mineral mixture and use of the batch for the production of non-molded or molded refractory products, which are in situ resistant to a great extent to the attack of fayalitic slags (iron silicate slags) and sulfates and are resistant to non-ferrous metal melts, particularly to copper melt. The invention furthermore relates to a brick composed of a batch according to the invention.

Fayalitic slags are formed, for example, in the production of copper from copper pyrite ($CuFeS_2$). Copper pyrite is roasted, resulting in the formation of what is called copper matte, which contains copper sulfide ($Cu_2S$) and iron compounds, for example FeS and $Fe_2O_3$. The copper matte is processed further to produce crude copper, wherein molten copper matte is treated in a converter, with a supply of air and the addition of $SiO_2$, for example in the form of quartz. In this connection, a fayalitic slag is formed, which mainly contains the mineral fayalite ($2FeO.SiO_2$) and crude copper oxide ($Cu_2O$).

At present, converters for the production of crude copper, for example a Pierce-Smith converter, are mainly lined on the fire side with burnt magnesia chromite products (e.g. DE 14 71 231 A1). However, in this connection, these refractory products are only insufficiently resistant to attack by sulfates, which result from oxidation of the sulfides, for example in the form of magnesium sulfate. Magnesia chromite bricks furthermore have only limited or insufficient high-temperature anti-wetting properties, and they demonstrate insufficient penetration resistance to hot non-ferrous metal melts, particularly copper melts.

Magnesia chromite bricks are also used in melting units for the production of other non-ferrous metals (non-ferrous metals such as Ni, Pb, Sn, Zn), and there they result in similar problems.

It is the task of the invention to create a refractory mineral batch for refractory products and refractory products produced from it, which have good anti-wetting properties against non-ferrous metal melts, particularly against copper melt, when used in a refractory lining, result in improved penetration resistance to fayalitic slags, and guarantee better resistance to sulfate attack at usage temperatures than the refractory products used in this refractory sector until now.

This task of the invention is accomplished by means of a refractory batch that is mainly formed, for example by more than 90 wt.-%, from a dry substance mixture composed of olivine raw material, magnesia meal (MgO meal), silicon carbide meal (SiC meal), and a dry fine-particle silica.

Furthermore, a dry batch according to the invention can contain up to 10, particularly up to 5 wt.-% anti-oxidants usually used for refractory products and/or other additives and/or admixtures usually used for refractory products, wherein, however, the proportion of the components olivine, MgO, SiC, and $SiO_2$ is supposed to be kept the same.

The naturally occurring olivine raw material, which is available on the market, is used, according to the invention, as what is called a coarse-grain granulate in the field, and is supposed to have 100 wt.-% if at all possible, but at least 70 wt.-% of the mineral forsterite, according to the invention. The remainder can be the mineral fayalite and/or other known contaminants of the raw material, such as enstatite and/or monticellite and/or merwinite. It lies within the scope of the invention to use a synthetically produced, pure forsterite material by itself or in combination with a natural olivine raw material. To the extent that olivine raw material is mentioned within the scope of the invention, this also relates to the synthetic forsterite material.

The grain size of the olivine raw material granulate that is used lies in the medium-grain and coarse-grain range, for example between 0.1 and 6, particularly between 1 and 6 mm, wherein the granulate has a Gaussian grain size distribution, for example.

Magnesia is used in fine-particle form, in the form of a meal or powder having grain sizes, for example of 100 wt.-%≤1 mm. As magnesia, for example melt magnesia and/or sintered magnesia and/or synthetic dead-burned or caustic magnesia is used. (The terms "meal" and "powder" are understood within the scope of the invention as being the same terms having the same meaning, and are known in the field. They are generally understood to mean dry, loose bulk material composed of solid particles≤1 mm particle size.)

The MgO content of the magnesia should preferably amount to >90 wt.-%, particularly >95 wt.-%. The remainder is usual contaminants such as silicates and/or iron oxide.

The MgO meals also have a Gaussian grain size distribution, for example.

Silicon carbide (SiC) is available on the market as a synthetic product having a high degree of purity, and in different grain sizes and grain size distributions, and is used, according to the invention, in powder form or in meal form, for example with grain sizes of 100 wt.-%≤1 mm. The grain size distribution preferably corresponds to a Gaussian grain distribution.

The SiC powder is used, for example, at a purity of >90 wt.-%, particularly >94 wt.-% of SiC.

The fine-particle, dry silica is a silica that reacts with the MgO of the magnesia meal in an aqueous milieu, forming magnesium silicate hydrate phases, and for example forms magnesium silicate hydrate gel and/or magnesium silicate hydrate crystallites and/or magnesium silicate hydrate crystals. The $SiO_2$ content of the fine-particle dry silica preferably lies above 90 wt.-%, particularly above 94 wt.-%. According to the invention, the batch according to the invention contains no liquid water containing silicas, such as silica sol or silica gel or sodium silicate or the like, in the batch. It has surprisingly been shown that with entrance of water to the batch according to the invention dry fine-particle silica forms MSH phases with the MgO of the magnesia more quickly and hardens more quickly and yields higher cold pressure strengths. It has not yet been clarified why this is so.

The silica should be selected to be so fine-particle that a reaction between the MgO of the magnesia particles and particles of the silica occurs in a batch fresh-mass that is formed by adding water to a dry batch according to the invention and mixing, and that magnesium silicate hydrate phases—also referred to as MSH phases hereinafter—form, for example as gel and/or crystallites and/or crystals, which phases bring about solidification of the aqueous mass in the manner of hydraulic binding. Preferably, for this purpose the batch is composed in such a manner that in the aqueous milieu, in other words after addition of water to the batch according to the invention, a pH above 7, particularly above 10 occurs.

Accordingly, crystalline quartz meals having a fineness of the quartz particles of below 500, particularly below 200 Ξm, for example, are suitable for the reaction to form MSH phases.

Furthermore, the following are particularly well suited for the invention as dry, fine-article silicas:

Silica Dust
Silica dust is a very fine, non-crystalline, amorphous $SiO_2$ powder, which occurs in an arc furnace as a byproduct in the production of elemental silicon or of silicon alloys. It is offered on the market under the trade name silica dust or microsilica, for example, and generally has more than 85 wt.-% $SiO_2$. The particle size of the silica dust—also called silica fume—generally lies below 1 mm. The English term is "silica fume."

Pyrogenic Silica
Pyrogenic silicas are very pure, amorphous $SiO_2$ powders having $SiO_2$ contents up to 99 wt.-%, for example, and generally having particle sizes between 5 and 50 nm, for example, and having a high specific surface area between 50 and 600 $m^2/g$, for example. These silicas are produced by means of flame hydrolysis. Pyrogenic silicas are offered on the market under the trade name Aerosil, for example. The English term is "fumed silica."

Precipitated Silica
In the production of precipitated silica, using a wet method, one proceeds from alkali silicate solutions, from which very pure amorphous silicas are precipitated by adding acid (86-88 wt.-% $SiO_2$; 10-12 wt.-% water). The particle size lies between 1 and 200 μm, and the specific surface area lies between 10 and 500 m2/g. Precipitated silicas are sold under the trade names "Sipernat" or "Ultrasil," for example. In spite of the water content, these silicas are not liquid, but rather dry and powdery.

Within the scope of the invention, at least one of the aforementioned silicas is used. It is practical if the silicas are selected with reference to their ability to react with the MgO of the magnesia meal, and if it is ensured that the silica reacts with the MgO as completely as possible during hardening.

The fine-particle, dry silica is used in the dry batch mixture at 0.1 to 10, particularly at 0.5 to 5 wt.-%.

According to the invention, preferably only water is mixed into the dry batches according to the invention as described above, calculated to 100 wt.-%, to produce refractory products according to the invention.

Preferably, the following dry batches are therefore compiled, in wt.-%:

Olivine raw material: 3 to 74, particularly 24 to 63.7
Magnesia meal: 25 to 49, particularly 30 to 45
SiC meal: 0.9 to 14, particularly 5 to 14
Fine-particle silica: 0.1 to 10, particularly 0.5 to 5
Anti-oxidants: 0 to 4, particularly 0.5 to 2.5
Additional Refractory
raw material granulate: 0 to 4, particularly 0.1 to 3.5
Refractory additive: 0 to 4, particularly 0.1 to 3.5
Admixture for Refractory
products: 0 to 2, particularly 0.1 to 1.5
Binder for Refractory
products: 0 to 10
Preferably, the silica is at least one of the above amorphous silicas.

The amounts of the reaction partners MgO and $SiO_2$ in batches according to the invention are selected in such a manner that when water is added at 1 to 10, particularly at 2.5 to 6 wt.-%, with reference to the dry substance of the batch, during a time period between 6 and 120, particularly between 8 and 12 hours, in a temperature range from 50 to 200, particularly from 100 to 150° C., cold pressure strengths from 40 to 160, particularly from 60 to 150 MPa can be guaranteed.

Preferably, it is provided, according to the invention, that the MgO of the magnesia meal that is capable of reaction is present, in terms of amount, predominating over the fine-particle silica that is capable of reaction. From this, the result is to be achieved that after water is added, MgO-rich MSH phases are formed, which can form forsterite (2 $MgO.SiO_2$), which increases the forsterite proportion of the olivine raw material, under the effect of high temperatures up to 1350° C., for example.

According to the invention, predominant mass ratios of MgO to $SiO_2$ of up to 500 are practical. In particular, the ratio lies between 1.2 and 100, preferably between 1.34 and 50, very particularly preferably between 1.34 and 35.

Refractory products according to the invention are produced from dry batches according to the invention after water is added, wherein a mixture with amounts of water, with reference to the mass of the dry batch, amounts to 1 to 10 wt.-%, preferably 2.5 to 6.0 wt.-%.

Water containing so-called fresh masses are pressed, according to the invention, to produce molded brick blanks, with water contents between 1 and 5, particularly between 1.5 and 3 wt.-%, for example, using usual pressing methods. The molded bricks are allowed to harden and dry in a temperature range between 15 and 200, preferably between 50 and 200, particularly between 100 and 150° C., according to the invention, wherein MSH phases are formed. After hardening, the bricks have relatively high strength values and can be handled, so that a refractory lining can be built from them. According to the invention, the bricks have cold pressure strength values between 40 and 100, particularly between 60 and 80 MPa, for example.

It lies within the scope of the invention to ceramically fire the molded bricks that have been hardened or solidified and dried by means of the formation of MSH phases, so that sintered products, for example composed of forsterite, are preferably formed from the MSH phases, and sinter bridges composed of forsterite, for example, form between the olivine grains or olivine particles and/or MgO meal particles and/or SiO2 particles. Ceramic firing is preferably carried out in the temperature range from 400 to 1400, particularly from 600 to 1200° C., and during a time period of 1 to 24, particularly of 4 to 12 hours, wherein it is advantageous to perform the firing in a reducing atmosphere.

It is sufficient for pressing bricks and forming MSH phases to add 1 to 5, particularly 1.5 to 3 wt.-% water to a batch according to the invention. It lies within the scope of the invention to add known flow agents to the water-containing mix, in order to increase the ductility of the mix. Such flow agents are known to a person skilled in the art. They are generally added in amounts of 0.01 to 2, particularly of 0.1 to 1.5 wt.-%.

According to the invention, ductile casting masses or ramming masses are produced from the dry batches according to the invention, using higher water contents, for example of 4 to 10 wt.-%, particularly of 4 to 6 wt.-%, and from these masses, refractory, monolithically preformed finished parts are produced by means of shaping in molds. In this connection, solidification by means of the formation of MSH phases takes place, for example, at room temperature, and drying takes place with a correspondingly elevated temperature treatment. The strength development of the molded mass corresponds to that of the molded and tempered bricks. In general, however, the strength values actually lie higher. Within the scope of the present invention, the term "tempering" is supposed to mean temperature treatment of the water-containing batch, in the temperature range indicated, including drying.

It is practical if a product according to the invention is produced in that a homogeneous batch having a predetermined plastic or ductile or flow-capable processability is produced from a batch having at least the dry substances of olivine raw material, magnesia, SiC, and silica and water by using suitable mixers. This ductile or flow-capable mass of the batch can be used on site for lining melt converters. As has already been described, however, monolithically molded finished parts or pressed bricks can also be produced from the batch; the latter can be used in unfired or ceramically fired form to line melt converters, for example.

The invention therefore relates to a dry batch composed exclusively of or, for example mainly of, i.e. for example by over 90 wt.-%, particularly over 95 wt.-%, olivine granulate, MgO meal and SiC meal and a fine-particle, dry $SiO_2$ component, particularly in the form of microsilica. The remainder, in each instance, can be, for example, at least one other refractory raw material granulate such as magnesia chromite, magnesium spinels, spinels, chromium oxide, zirconium oxide, silicon nitride, zirconium and/or at least one refractory additive such as magnesia chromite, magnesium spinels, spinels, chromium oxide, zirconium oxide, silicon nitride, zirconium and/or at least one admixture such as liquefiers and/or binding regulators.

For example, within the scope of the invention, pressed or non-pressed molded bodies are produced from a commixture batch containing water as indicated above, by means of pressing, and the molded bodies are brought to residual moisture values of preferably between 0.1 and 2 wt.-%, or, according to a further embodiment of the invention, the molded bodies are additionally fired ceramically in a ceramic firing kiln, at temperatures between preferably 400 and 1400, particularly between 600 and 1200° C., in an oxidizing atmosphere, particularly, however, in a reducing atmosphere, for a time period preferably between 1 and 24, particularly between 4 and 12 hours. In this connection, the firing conditions are selected, according to the invention, in such a manner that the components olivine raw material and SiC do not react with one another, if at all possible, or react only to a small proportion during firing, so that these components are available in situ in the melting unit, for example in the converter, during attack of a melt and/or slag, in order to guarantee refractoriness, according to the invention, particularly by means of an anti-wetting effect and chemical resistance to melt and slag components.

Using the non-fired and fired molded bodies according to the invention, it is possible to create linings of non-ferrous metal melt converters that are superior to the previous linings, with regard to infiltration resistance and corrosion resistance to non-ferrous metal melts and non-metallic melts (liquid slags) of non-ferrous metal smelting. In particular, the superiority of the refractory products according to the invention shows itself in copper melt converters, for example in a Pierce-Smith converter (PS converter).

The non-fired, pressed, dried molded bodies according to the invention have the following properties, for example:
Raw density: 2.65 to 2.80 kg/m³
Cold pressure strength: 40 to 100, particularly 60 to 80 MPa.

The fired molded bodies according to the invention have the following properties, for example:
Raw density: 2.55 to 2.75 kg/m³,
Cold pressure strength: 30 to 80, particularly 40 to 70 MPa.

The finished parts according to the invention have the following properties, for example:
Raw density: 2.55 to 2.75 kg/m³
Cold pressure strength: 40 to 180, particularly 50 to 150 MPa.

The products according to the invention are specifically suitable for use in PS converters for copper production, but they can also be used, with the advantages described, in other applications in which fayalitic slags and runny non-ferrous metal melts occur, as is the case in practically the entire non-ferrous metal industry, with advantages as compared with the usual refractory products.

The concept according to the invention is based on the fact that based on olivine coarse grain as well as SiC and MgO fine grain or meal grain, equilibrium in the brick occurs, between the reaction substances from the brick and the slag, only at melting process temperatures above 1000° C., for example between 1200 and 1350° C. At these temperatures, SiC is still fully effective, in spite of oxidizing melting process conditions, with regard to the anti-wetting effect. MgO reacts with the oxidation product of the SiC that occurs, namely the $SiO_2$, to form further forsterite. MgO is selected, according to the invention, in stoichiometric excess to $SiO_2$ that is available for reaction, in order to prevent the formation of enstatite, which is not refractory. These reactions in situ during the melting process seal the brick directly on the fire side, and prevent penetration by the very runny metal melt, for example copper melt. The SiC furthermore acts as a slag brake. In contact with the omnipresent fayalite slags, the excess MgO furthermore reacts, together with the forsterite, to form olivine mixed crystals. The solidus temperature is thereby increased, i.e. the reaction product of slag/brick solidifies, i.e. it leads to stiffening of the slag, and the corrosion reaction is stopped or at least greatly reduced.

According to the invention, the pressed molded bodies, which have a water content between 1 and 5, particularly between 1.5 and 3, are therefore allowed to harden, wherein the MSH phases form, which bring about the hardening. The hardening time is temperature-dependent. It is practical if the pressed molded bodies are allowed to harden and dry in the temperature range between 50 and 200, particularly between 100 and 150° C., for 6 to 120, particularly for 24 to 96 hours, until they reach a residual moisture between 0.1 and 4.5, particularly between 0.1 and 2.5 wt.-% water content, in a suitable drying unit. In this connection, cold pressure strengths between 40 and 100, particularly between 60 and 80 MPa are achieved.

The non-pressed fresh masses produced according to the invention, which are cast into molds and vibrated, if necessary, for monolithic finished components, have water contents between 4 and 10, particularly between 4 and 6 wt.-%. They are introduced into molds and vibrated, if necessary. They are allowed to harden in air between 15 and 35° C., for example, and to dry in the temperature range indicated above for the pressed molded bodies, down to residual moisture values as for the pressed molded bodies. In this connection, cold pressure strengths between 40 and 180, particularly between 50 and 150 MPa are achieved.

According to a further embodiment of the invention, at least one known water-containing binder for refractory products, from the following group: lignin sulfonate, magnesium sulfate, and ethyl silicate, is used in place of water or preferably in combination with it, in an amount calculated relative to the dry substance of a batch of 2 to 5 wt.-%, for example, for pressed products, and of 4 to 10 wt.-%, for example, for finished components and casting masses. In this connection, the water proportion of these binders contributes to the MSH phase formation described above.

Furthermore, within the scope of the further embodiment of the invention, a known binder for refractory products, from the group of pitch and/or tar and the known synthetic resins such as phenolic formaldehyde resins can be used in place of water, in amounts of 2 to 5 wt.-%, for example, calculated as above, in each instance. The additional forsterite only forms in situ at higher temperatures, because of the presence of MgO and $SiO_2$ in the commixture.

The invention therefore creates the following new refractory batches and their use.

The invention essentially relates to a batch composed of mineral, refractory materials for the lining of units used for non-ferrous metal melts, preferably for the lining of copper melt converters, containing a) a dry batch mixture consisting of the following components:
- 3 to 74 wt.-% of at least one coarse-grain olivine raw material having forsterite contents of at least 70 wt.-%, particularly at least 90 wt.-%, preferably at least 100 wt.-%, having grain sizes of above 0.1 mm,
- 25 to 49 wt.-% of at least one magnesia in meal form, having grain sizes≤1 mm,
- 0.9 to 14 wt.-% of at least one silicon carbide (SiC) in meal form with grain sizes≤1 mm,
- 0.1 to 10 wt.-% of at least one fine-particle, dry, powder-form silica, preferably having particle sizes≤500 μm,
- 0 to 4 wt.-% of at least one known anti-oxidant for refractory products,
- 0 to 4 wt.-% of at least one known additional refractory raw material granulate, preferably having grain sizes of 50 wt.-%, particularly of 80 wt.-%, preferably of 100 wt.-% above 0.1 mm,
- 0 to 2 wt.-% of at least one known admixture for the production of refractory products for batches,
- 0 to 4 wt.-% of at least one known additive composed of refractory materials, particularly in meal form, preferably also in the form of what is called medium grain and/or what is called coarse grain,
- 0 to 10 wt.-% of at least one known binder for refractory products in dry form, and b) water and/or at least one aqueous binder or at least one binder from the group of pitch and/or tar and synthetic resins.

It lies within the scope of the invention to combine this batch according to the invention with at least one characteristic of the following characteristics:

The dry batch mixture consists of the following components:
- 21 to 63.7 wt.-% of the at least one olivine raw material,
- 30 to 43 wt.-% of the at least one magnesia,
- 5 to 14 wt.-% of the at least one silicon carbide,
- 0.5 to 5 wt.-% of the at least one silica,
- 0.5 to 2.5 wt.-% of the at least one anti-oxidant,
- 0.1 to 3.5 wt.-% of the at least one additional refractory raw material granulate,
- 0.1 to 1.5 wt.-% of the at least one admixture,
- 0.1 to 3.5 wt.-% of the at least one additive,
- 0 to 5 wt.-% of the at least one binder mentioned.

The olivine raw material is a natural olivine raw material and/or a synthetically produced forsterite material having grain bands of the olivine raw material in what is called the medium-grain and coarse-grain range, for example between 0.1 and 6, particularly between 1 and 6 mm, and preferably having a Gaussian grain distribution.

The MgO content of the magnesia meal lies above 90 wt.-%, particularly above 95 wt.-%, and the grain distribution of the magnesia meal corresponds to a Gaussian grain distribution, for example.

The silicon carbide meal has a purity of more than 90 wt.-%, particularly more than 94 wt.-%, and preferably has a Gaussian grain distribution.

The silica is at least one quartz meal having a grain size of less than 500 μm and/or at least one pyrogenic silica and/or at least one precipitated silica and/or at least one silica fume.

The batch comprises at least one admixture from the following group:
- liquefiers, for example Castament (FS20), manufacturer BASF, or Dolapix (FF44), manufacturer Zschimmer and Schwarz.

The batch comprises at least one additive granulate and/or one additive from the following group:
- magnesia chromite, magnesia spinels, spinels, chromium oxide, zirconium oxide, silicon nitride, zirconium.

The invention also relates to a method for the production of a refractory product, using a batch mentioned above, wherein the dry batch mixture is mixed with water to form an aqueous mass, the mass is introduced into a mold and formed into a molded body, and subsequently the mass of the molded body is allowed to harden and the molded body is dried, particularly down to a maximal residual moisture between 0.1 and 4.5 wt.-%.

For pressed products, hardening and drying takes place at temperatures between 50 and 200° C., particularly between 100 and 150° C.

For monolithic finished components and casting masses, hardening takes place between 15 and 35° C., and drying takes place at temperatures between 50 and 200, particularly between 100 and 150° C.

In the method according to the invention, a water-containing mass is pressed to form molded bricks, and the molded bricks are allowed to harden and are dried, wherein preferably, the molded bricks are ceramically fired in a ceramic firing kiln, particularly at temperatures between 1,000 and 1,300, preferably between 1,150 and 1,250° C., in an oxidizing atmosphere, preferably in a reducing atmosphere, for example with a firing duration between 4 and 8, particularly between 5 and 8 hours.

In the method according to the invention, the dry batch mixture is mixed, in combination with water or in place of water, with at least one water-containing binder for refractory products, for example with an amount of 1 to 10 wt.-%, to form a ductile mass.

In the method according to the invention, the dry batch mixture is mixed, in place of water, with at least one binder from the group of pitch and/or tar and synthetic resins, for example with an amount of 2 to 5 wt.-%, to form a ductile mass.

The invention also relates to a molded brick, produced according to a method according to the invention, having a raw density between 2.65 and 2.80 kg/m$^3$ and a pressure strength between 25 and 50, particularly between 35 and 45 MPa.

The invention claimed is:

1. A batch composition comprising:
a) a dry batch mixture comprising the following components:
   3 to 74 wt.-% of at least one coarse-grain olivine raw material having forsterite contents of at least 70 wt.-% and having grain sizes above 0.1 mm;
   25 to 49 wt.-% of at least one magnesia in powder form, having grain sizes≤1 mm;
   0.9 to 14 wt.-% of at least one silicon carbide (SiC) in powder form, with grain sizes≤1 mm;
   0.1 to 10 wt.-% of at least one fine-particle, dry, powder-form silica;
   0 to 4 wt.-% of at least one anti-oxidant for refractory products;
   0 to 4 wt.-% of at least one additional refractory raw material granulate;
   0 to 2 wt.-% of at least one admixture for the production of refractory products; and
   0 to 4 wt.-% of at least one additive composed of refractory materials; and
b) water and/or at least one aqueous binder or at least one non aqueous liquid binder selected from the group consisting of pitch, tar, and synthetic resins.

2. The batch composition according to claim 1, wherein the dry batch mixture comprises the following components:
21 to 63.7 wt.-% of the at least one olivine raw material;
30 to 43 wt.-% of the at least one magnesia;
5 to 14 wt.-% of the at least one silicon carbide;
0.5 to 5 wt.-% of the at least one silica;
0.5 to 2.5 wt.-% of the at least one anti-oxidant;
0.1 to 3.5 wt.-% of the at least one additional refractory raw material granulate;
0.1 to 1.5 wt.-% of the at least one admixture;
0.1 to 3.5 wt.-% of the at least one additive;
0 to 5 wt.-% of at least one dry binder.

3. The batch composition according to claim 1, wherein the at least one olivine raw material is a natural olivine material and/or a synthetically produced forsterite material having grain bands of the at least one olivine raw material between 0.1 and 6 mm or between 1 and 6 mm.

4. The batch composition according to claim 1, wherein all of the at least one magnesia in powder form has an MgO content lying above 90 wt.-%.

5. The batch composition according to claim 1, wherein all of the at least one silicon carbide in powder form has a purity of above 90 wt.-%.

6. The batch composition according to claim 1, wherein the at least one fine-particle, dry, powder-form silica is at least one quartz powder having a grain size of less than 500 μm and/or at least one pyrogenic silica and/or at least one precipitated silica and/or at least one silica fume.

7. The batch composition according to claim 1, wherein the at least one admixture is selected from the following group:
a liquefier and a binding regulator, wherein the liquefier is based on polycarboxylateether.

8. The batch composition according to claim 1, wherein the at least one additional refractory raw material granulate and/or the at least one additive composed of refractory materials is selected from the following group: magnesia chromite, magnesia spinels, spinels, chromium oxide, zirconium oxide, silicon nitride, zirconium.

9. A method for the production of a refractory product, comprising:
providing a dry batch mixture comprising the following components:
   3 to 74 wt.-% of at least one coarse-grain olivine raw material having forsterite contents of at least 70 wt.-% and having grain sizes above 0.1 mm;
   25 to 49 wt.-% of at least one magnesia in powder form, having grain sizes≤1 mm;
   0.9 to 14 wt.-% of at least one silicon carbide (SiC) in powder form, with grain sizes≤1 mm;
   0.1 to 10 wt.-% of at least one fine-particle, dry, powder-form silica;
   0 to 4 wt.-% of at least one anti-oxidant for refractory products;
   0 to 4 wt.-% of at least one additional refractory raw material granulate;
   0 to 2 wt.-% of at least one admixture for the production of refractory products; and
   0 to 4 wt.-% of at least one additive composed of refractory materials;
mixing the dry batch mixture with water to form an aqueous mass;
introducing the aqueous mass into a mold and forming the aqueous mass into a molded body;
subsequently allowing the molded body to harden; and
drying the molded body.

10. The method according to claim 9, wherein for pressed products, hardening and drying takes place at temperatures between 50 and 200° C.

11. The method according to claim 9, wherein for monolithic finished components and casting masses, hardening takes place between 15 and 35° C., and drying takes place at temperatures between 50 and 200° C.

12. The method according to claim 9, wherein the forming comprises pressing the aqueous mass; and wherein the molded body is a molded brick.

13. The method according to claim 9, wherein the dry batch mixture is also mixed with at least one aqueous binder for refractory products to form the aqueous mass; and wherein the aqueous mass is ductile.

14. A method for the production of a refractory product, comprising:
providing a dry batch mixture comprising the following components:
   3 to 74 wt.-% of at least one coarse-grain olivine raw material having forsterite contents of at least 70 wt.-% and having grain sizes above 0.1 mm;
   25 to 49 wt.-% of at least one magnesia in powder form, having grain sizes≤1 mm;
   0.9 to 14 wt.-% of at least one silicon carbide (SiC) in powder form, with grain sizes≤1 mm;
   0.1 to 10 wt.-% of at least one fine-particle, dry, powder-form silica;
   0 to 4 wt.-% of at least one anti-oxidant for refractory products;
   0 to 4 wt.-% of at least one additional refractory raw material granulate;
   0 to 2 wt.-% of at least one admixture for the production of refractory products; and
   0 to 4 wt.-% of at least one additive composed of refractory materials;

mixing the dry batch mixture with at least one non aqueous liquid binder selected from the group consisting of pitch, tar, and synthetic resins to form a ductile mass;

introducing the ductile mass into a mold and forming the ductile mass into a molded body;

subsequently allowing the molded body to harden; and drying the molded body.

15. A method for the production of a refractory product, comprising:

providing a dry batch mixture comprising the following components:

3 to 74 wt.-% of at least one coarse-grain olivine raw material having forsterite contents of at least 70 wt.-% and having grain sizes above 0.1 mm;

25 to 49 wt.-% of at least one magnesia in powder form, having grain sizes≤1 mm;

0.9 to 14 wt.-% of at least one silicon carbide (SiC) in powder form, with grain sizes≤1 mm;

0.1 to 10 wt.-% of at least one fine-particle, dry, powder-form silica;

0 to 4 wt.-% of at least one anti-oxidant for refractory products;

0 to 4 wt.-% of at least one additional refractory raw material granulate;

0 to 2 wt.-% of at least one admixture for the production of refractory products; and 0 to 4 wt.-% of at least one additive composed of refractory materials;

mixing the dry batch mixture with at least one aqueous binder for refractory products to form an aqueous ductile mass;

introducing the aqueous ductile mass into a mold and forming the aqueous ductile mass into a molded body;

subsequently allowing the molded body to harden; and drying the molded body.

16. The batch composition according to claim 1, wherein the batch composition consists of the dry batch mixture and water and/or the at least one aqueous binder or the at least one non aqueous liquid binder selected from the group consisting of pitch, tar, and synthetic resins.

17. The batch composition according to claim 1, wherein the at least one fine-particle, dry, powder-form silica has particle sizes≤500 μm.

18. The batch composition according to claim 1, wherein the at least one additional refractory raw material granulate has grain sizes of 100 wt.-% above 0.1 mm.

19. The batch composition according to claim 1, wherein the at least one additive is present in powder form.

20. The batch composition according to claim 3, wherein the at least one olivine raw material has a Gaussian grain distribution.

21. The batch composition according to claim 4, wherein a grain distribution of the at least one magnesia in powder form corresponds to a Gaussian grain distribution.

22. The batch composition according to claim 5, wherein the at least one silicon carbide in powder form has a Gaussian grain distribution.

23. The method according to claim 9, wherein the molded body is dried up to a maximal residual moisture between 0.1 and 4.5 wt.-%.

24. The method according to claim 12, wherein the molded bricks are ceramically fired in a ceramic firing kiln.

25. The method according to claim 24, wherein the molded bricks are fired at temperatures between 1,000 and 1,300° C. in an oxidizing atmosphere or in a reducing atmosphere.

26. The method according to claim 13, wherein the dry batch mixture is mixed with 1 to 10 wt.-% with reference to the dry batch mixture of the at least one aqueous binder.

27. The method according to claim 14, wherein the dry batch mixture is mixed with 2 to 5 wt.-% with reference to the dry batch mixture of the binder.

28. The method according to claim 15, wherein the dry batch mixture is mixed with 1 to 10 wt.-% with reference to the dry batch mixture of the at least one aqueous binder.

29. The batch composition according to claim 1, wherein the dry batch mixture contains more than 90 wt.-% of dry substances comprising the olivine material, the at least one magnesia in powder form, the at least one silicon carbide in powder form and the at least one fine-particle, dry, powder form silica; and wherein the at least one fine-particle, dry, powder form silica is a pulverulent.

30. The batch composition according to claim 29, wherein the dry batch mixture consists of the dry substances.

31. The batch composition according to claim 1, wherein the batch composition comprises no silica sol.

* * * * *